(12) United States Patent
Shalvi (10) Patent No.: US 8,270,246 B2
(45) Date of Patent: Sep. 18, 2012

(54) OPTIMIZED SELECTION OF MEMORY CHIPS IN MULTI-CHIPS MEMORY DEVICES

(75) Inventor: Ofir Shalvi, Ra'anana (IL)

(73) Assignee: Apple Inc., Cupertino, CA (US)

( * ) Notice: Subject to any disclaimer, the term of this patent is extended or adjusted under 35 U.S.C. 154(b) by 309 days.

(21) Appl. No.: 12/680,901

(22) PCT Filed: Nov. 4, 2008

(86) PCT No.: PCT/IL2008/001446
§ 371 (c)(1),
(2), (4) Date: Mar. 31, 2010

(87) PCT Pub. No.: WO2009/063450
PCT Pub. Date: May 22, 2009

(65) Prior Publication Data
US 2010/0220510 A1    Sep. 2, 2010

Related U.S. Application Data

(60) Provisional application No. 60/987,417, filed on Nov. 13, 2007.

(51) Int. Cl.
*G11C 8/00* (2006.01)
(52) U.S. Cl. ..................... 365/230.03; 365/63
(58) Field of Classification Search ............. 365/230.03, 365/63, 200; 711/103, 109, 154
See application file for complete search history.

(56) References Cited

U.S. PATENT DOCUMENTS

| | | |
|---|---|---|
| 3,668,631 A | 6/1972 | Griffith et al. |
| 3,668,632 A | 6/1972 | Oldham |
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahashi et al. |

(Continued)

FOREIGN PATENT DOCUMENTS

EP    0783754 B1    7/1997

(Continued)

OTHER PUBLICATIONS

U.S. Appl. No. 12/534,898 Official Action dated Mar. 23, 2011.

(Continued)

*Primary Examiner* — Vu Le
(74) *Attorney, Agent, or Firm* — Meyertons, Hood, Kivlin, Kowert & Goetzel, P.C.

(57) ABSTRACT

A method includes accepting a definition of a type of multi-unit memory device (28) including a set of memory units (24), each having a respective nominal storage capacity, the definition specifying a target memory size of the memory device such that a sum of nominal storage capacities of the memory units in the set is equal to the target memory size. A plurality of the memory units is accepted. The memory units have respective actual storage capacities, at least some of which differ from the respective nominal storage capacity. Multi-unit memory devices including respective sets of the memory units are assembled, such that at least one of the sets includes at least a first memory unit having a first actual capacity that is less than the respective nominal capacity and at least a second memory unit having a second actual capacity that is greater than the nominal capacity.

31 Claims, 2 Drawing Sheets

U.S. PATENT DOCUMENTS

| | | | |
|---|---|---|---|
| 4,558,431 A | 12/1985 | Satoh | |
| 4,608,687 A | 8/1986 | Dutton | |
| 4,654,847 A | 3/1987 | Dutton | |
| 4,661,929 A | 4/1987 | Aoki et al. | |
| 4,768,171 A | 8/1988 | Tada | |
| 4,811,285 A | 3/1989 | Walker et al. | |
| 4,899,342 A | 2/1990 | Potter et al. | |
| 4,910,706 A | 3/1990 | Hyatt | |
| 4,993,029 A | 2/1991 | Galbraith et al. | |
| 5,056,089 A | 10/1991 | Furuta et al. | |
| 5,077,722 A | 12/1991 | Geist et al. | |
| 5,126,808 A | 6/1992 | Montalvo et al. | |
| 5,163,021 A | 11/1992 | Mehrotra et al. | |
| 5,172,338 A | 12/1992 | Mehrotra et al. | |
| 5,182,558 A | 1/1993 | Mayo | |
| 5,182,752 A | 1/1993 | DeRoo et al. | |
| 5,191,584 A | 3/1993 | Anderson | |
| 5,200,959 A | 4/1993 | Gross et al. | |
| 5,237,535 A | 8/1993 | Mielke et al. | |
| 5,272,669 A | 12/1993 | Samachisa et al. | |
| 5,276,649 A | 1/1994 | Hoshita et al. | |
| 5,287,469 A | 2/1994 | Tsuboi | |
| 5,365,484 A | 11/1994 | Cleveland et al. | |
| 5,388,064 A | 2/1995 | Khan | |
| 5,416,646 A | 5/1995 | Shirai | |
| 5,416,782 A | 5/1995 | Wells et al. | |
| 5,446,854 A | 8/1995 | Khalidi et al. | |
| 5,450,424 A | 9/1995 | Okugaki et al. | |
| 5,469,444 A | 11/1995 | Endoh et al. | |
| 5,473,753 A | 12/1995 | Wells et al. | |
| 5,479,170 A | 12/1995 | Cauwenberghs et al. | |
| 5,508,958 A | 4/1996 | Fazio et al. | |
| 5,519,831 A | 5/1996 | Holzhammer | |
| 5,532,962 A | 7/1996 | Auclair et al. | |
| 5,533,190 A | 7/1996 | Binford et al. | |
| 5,541,886 A | 7/1996 | Hasbun | |
| 5,600,677 A | 2/1997 | Citta et al. | |
| 5,638,320 A | 6/1997 | Wong et al. | |
| 5,657,332 A | 8/1997 | Auclair et al. | |
| 5,675,540 A | 10/1997 | Roohparvar | |
| 5,682,352 A | 10/1997 | Wong et al. | |
| 5,687,114 A | 11/1997 | Khan | |
| 5,696,717 A | 12/1997 | Koh | |
| 5,726,649 A | 3/1998 | Tamaru et al. | |
| 5,726,934 A | 3/1998 | Tran et al. | |
| 5,742,752 A | 4/1998 | De Koning | |
| 5,748,533 A | 5/1998 | Dunlap et al. | |
| 5,748,534 A | 5/1998 | Dunlap et al. | |
| 5,751,637 A | 5/1998 | Chen et al. | |
| 5,761,402 A | 6/1998 | Kaneda et al. | |
| 5,798,966 A | 8/1998 | Keeney | |
| 5,799,200 A | 8/1998 | Brant et al. | |
| 5,801,985 A | 9/1998 | Roohparvar et al. | |
| 5,838,832 A | 11/1998 | Barnsley | |
| 5,860,106 A | 1/1999 | Domen et al. | |
| 5,867,114 A | 2/1999 | Barbir | |
| 5,867,428 A | 2/1999 | Ishii et al. | |
| 5,867,429 A | 2/1999 | Chen et al. | |
| 5,877,986 A | 3/1999 | Harari et al. | |
| 5,889,937 A | 3/1999 | Tamagawa | |
| 5,901,089 A | 5/1999 | Korsh et al. | |
| 5,909,449 A | 6/1999 | So et al. | |
| 5,912,906 A | 6/1999 | Wu et al. | |
| 5,930,167 A | 7/1999 | Lee et al. | |
| 5,937,424 A | 8/1999 | Leak et al. | |
| 5,942,004 A | 8/1999 | Cappelletti | |
| 5,946,716 A | 8/1999 | Karp et al. | |
| 5,969,986 A | 10/1999 | Wong et al. | |
| 5,982,668 A | 11/1999 | Ishii et al. | |
| 5,991,517 A | 11/1999 | Harari et al. | |
| 5,995,417 A | 11/1999 | Chen et al. | |
| 6,009,014 A | 12/1999 | Hollmer et al. | |
| 6,009,016 A | 12/1999 | Ishii et al. | |
| 6,023,425 A | 2/2000 | Ishii et al. | |
| 6,034,891 A | 3/2000 | Norman | |
| 6,040,993 A | 3/2000 | Chen et al. | |
| 6,041,430 A | 3/2000 | Yamauchi | |
| 6,073,204 A | 6/2000 | Lakhani et al. | |
| 6,101,614 A | 8/2000 | Gonzales et al. | |
| 6,128,237 A | 10/2000 | Shirley et al. | |
| 6,134,140 A | 10/2000 | Tanaka et al. | |
| 6,134,143 A | 10/2000 | Norman | |
| 6,134,631 A | 10/2000 | Jennings | |
| 6,141,261 A | 10/2000 | Patti | |
| 6,151,246 A | 11/2000 | So et al. | |
| 6,157,573 A | 12/2000 | Ishii et al. | |
| 6,166,962 A | 12/2000 | Chen et al. | |
| 6,169,691 B1 | 1/2001 | Pasotti et al. | |
| 6,178,466 B1 | 1/2001 | Gilbertson et al. | |
| 6,185,134 B1 | 2/2001 | Tanaka | |
| 6,209,113 B1 | 3/2001 | Roohparvar | |
| 6,212,654 B1 | 4/2001 | Lou et al. | |
| 6,219,276 B1 | 4/2001 | Parker | |
| 6,219,447 B1 | 4/2001 | Lee | |
| 6,222,762 B1 | 4/2001 | Guterman et al. | |
| 6,230,233 B1 | 5/2001 | Lofgren et al. | |
| 6,240,458 B1 | 5/2001 | Gilbertson | |
| 6,259,627 B1 | 7/2001 | Wong | |
| 6,275,419 B1 | 8/2001 | Guterman et al. | |
| 6,278,632 B1 | 8/2001 | Chevallier | |
| 6,279,069 B1 | 8/2001 | Robinson et al. | |
| 6,288,944 B1 | 9/2001 | Kawamura | |
| 6,292,394 B1 | 9/2001 | Cohen et al. | |
| 6,301,151 B1 | 10/2001 | Engh et al. | |
| 6,304,486 B1 | 10/2001 | Yano | |
| 6,307,776 B1 | 10/2001 | So et al. | |
| 6,314,044 B1 | 11/2001 | Sasaki et al. | |
| 6,317,363 B1 | 11/2001 | Guterman et al. | |
| 6,317,364 B1 | 11/2001 | Guterman et al. | |
| 6,345,004 B1 | 2/2002 | Omura et al. | |
| 6,360,346 B1 | 3/2002 | Miyauchi et al. | |
| 6,363,008 B1 | 3/2002 | Wong | |
| 6,363,454 B1 | 3/2002 | Lakhani et al. | |
| 6,366,496 B1 | 4/2002 | Torelli et al. | |
| 6,385,092 B1 | 5/2002 | Ishii et al. | |
| 6,392,932 B1 | 5/2002 | Ishii et al. | |
| 6,396,742 B1 | 5/2002 | Korsh et al. | |
| 6,397,364 B1 | 5/2002 | Barkan | |
| 6,405,323 B1 | 6/2002 | Lin et al. | |
| 6,405,342 B1 | 6/2002 | Lee | |
| 6,418,060 B1 | 7/2002 | Yang et al. | |
| 6,442,585 B1 | 8/2002 | Dean et al. | |
| 6,445,602 B1 | 9/2002 | Kokudo et al. | |
| 6,452,838 B1 | 9/2002 | Ishii et al. | |
| 6,456,528 B1 | 9/2002 | Chen | |
| 6,466,476 B1 | 10/2002 | Wong et al. | |
| 6,467,062 B1 | 10/2002 | Barkan | |
| 6,469,931 B1 | 10/2002 | Ban et al. | |
| 6,480,948 B1 | 11/2002 | Virajpet et al. | |
| 6,490,236 B1 | 12/2002 | Fukuda et al. | |
| 6,522,580 B2 | 2/2003 | Chen et al. | |
| 6,525,952 B2 | 2/2003 | Araki et al. | |
| 6,532,556 B1 | 3/2003 | Wong et al. | |
| 6,538,922 B1 | 3/2003 | Khalid et al. | |
| 6,549,464 B2 | 4/2003 | Tanaka et al. | |
| 6,553,510 B1 | 4/2003 | Pekny | |
| 6,558,967 B1 | 5/2003 | Wong | |
| 6,560,152 B1 | 5/2003 | Cernea | |
| 6,567,311 B2 | 5/2003 | Ishii et al. | |
| 6,577,539 B2 | 6/2003 | Iwahashi | |
| 6,584,012 B2 | 6/2003 | Banks | |
| 6,615,307 B1 | 9/2003 | Roohparvar | |
| 6,621,739 B2 | 9/2003 | Gonzalez et al. | |
| 6,640,326 B1 | 10/2003 | Buckingham et al. | |
| 6,643,169 B2 | 11/2003 | Rudelic et al. | |
| 6,646,913 B2 | 11/2003 | Micheloni et al. | |
| 6,678,192 B2 | 1/2004 | Gongwer et al. | |
| 6,683,811 B2 | 1/2004 | Ishii et al. | |
| 6,687,155 B2 | 2/2004 | Nagasue | |
| 6,707,748 B2 | 3/2004 | Lin et al. | |
| 6,708,257 B2 | 3/2004 | Bao | |
| 6,714,449 B2 | 3/2004 | Khalid | |
| 6,717,847 B2 | 4/2004 | Chen | |
| 6,731,557 B2 | 5/2004 | Beretta | |
| 6,732,250 B2 | 5/2004 | Durrant | |
| 6,738,293 B1 | 5/2004 | Iwahashi | |
| 6,751,766 B2 | 6/2004 | Guterman et al. | |

| | | |
|---|---|---|
| 6,757,193 B2 | 6/2004 | Chen et al. |
| 6,774,808 B1 | 8/2004 | Hibbs et al. |
| 6,781,877 B2 | 8/2004 | Cernea et al. |
| 6,804,805 B2 | 10/2004 | Rub |
| 6,807,095 B2 | 10/2004 | Chen et al. |
| 6,807,101 B2 | 10/2004 | Ooishi et al. |
| 6,809,964 B2 | 10/2004 | Moschopoulos et al. |
| 6,819,592 B2 | 11/2004 | Noguchi et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,851,081 B2 | 2/2005 | Yamamoto |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,870,773 B2 | 3/2005 | Noguchi et al. |
| 6,873,552 B2 | 3/2005 | Ishii et al. |
| 6,879,520 B2 | 4/2005 | Hosono et al. |
| 6,882,567 B1 | 4/2005 | Wong |
| 6,894,926 B2 | 5/2005 | Guterman et al. |
| 6,907,497 B2 | 6/2005 | Hosono et al. |
| 6,925,009 B2 | 8/2005 | Noguchi et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,958,938 B2 | 10/2005 | Noguchi et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 6,999,344 B2 | 2/2006 | Hosono et al. |
| 7,002,843 B2 | 2/2006 | Guterman et al. |
| 7,006,379 B2 | 2/2006 | Noguchi et al. |
| 7,012,835 B2 | 3/2006 | Gonzalez et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,072,222 B2 | 7/2006 | Ishii et al. |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,145,805 B2 | 12/2006 | Ishii et al. |
| 7,151,692 B2 | 12/2006 | Wu |
| 7,158,058 B1 | 1/2007 | Yu |
| 7,170,781 B2 | 1/2007 | So et al. |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzalez et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,644 B1 | 3/2007 | Anderson et al. |
| 7,196,928 B2 | 3/2007 | Chen |
| 7,196,933 B2 | 3/2007 | Shibata |
| 7,197,594 B2 | 3/2007 | Raz et al. |
| 7,200,062 B2 | 4/2007 | Kinsely et al. |
| 7,210,077 B2 | 4/2007 | Brandenberger et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,254,763 B2 | 8/2007 | Aadsen et al. |
| 7,257,027 B2 | 8/2007 | Park |
| 7,259,987 B2 | 8/2007 | Chen et al. |
| 7,266,026 B2 | 9/2007 | Gongwer et al. |
| 7,266,069 B2 | 9/2007 | Chu |
| 7,269,066 B2 | 9/2007 | Nguyen et al. |
| 7,272,757 B2 | 9/2007 | Stocken |
| 7,274,611 B2 | 9/2007 | Roohparvar |
| 7,277,355 B2 | 10/2007 | Tanzawa |
| 7,280,398 B1 | 10/2007 | Lee |
| 7,280,409 B2 | 10/2007 | Misumi et al. |
| 7,280,415 B2 | 10/2007 | Hwang et al. |
| 7,283,399 B2 | 10/2007 | Ishii et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,269 B2 | 12/2007 | Shibata |
| 7,310,271 B2 | 12/2007 | Lee |
| 7,310,272 B1 | 12/2007 | Mokhlesi et al. |
| 7,310,347 B2 | 12/2007 | Lasser |
| 7,312,727 B1 | 12/2007 | Feng et al. |
| 7,321,509 B2 | 1/2008 | Chen et al. |
| 7,328,384 B1 | 2/2008 | Kulkarni et al. |
| 7,342,831 B2 | 3/2008 | Mokhlesi et al. |
| 7,343,330 B1 | 3/2008 | Boesjes et al. |
| 7,345,924 B2 | 3/2008 | Nguyen et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,365,671 B1 | 4/2008 | Anderson |
| 7,388,781 B2 | 6/2008 | Litsyn et al. |
| 7,397,697 B2 | 7/2008 | So et al. |
| 7,405,974 B2 | 7/2008 | Yaoi et al. |
| 7,405,979 B2 | 7/2008 | Ishii et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,409,623 B2 | 8/2008 | Baker et al. |
| 7,420,847 B2 | 9/2008 | Li |
| 7,433,231 B2 | 10/2008 | Aritome |
| 7,433,697 B2 | 10/2008 | Karaoguz et al. |
| 7,434,111 B2 | 10/2008 | Sugiura et al. |
| 7,437,498 B2 | 10/2008 | Ronen |
| 7,440,324 B2 | 10/2008 | Mokhlesi |
| 7,440,331 B2 | 10/2008 | Hemink |
| 7,441,067 B2 | 10/2008 | Gorobets et al. |
| 7,447,970 B2 | 11/2008 | Wu et al. |
| 7,450,421 B2 | 11/2008 | Mokhlesi et al. |
| 7,453,737 B2 | 11/2008 | Ha |
| 7,457,163 B2 | 11/2008 | Hemink |
| 7,457,897 B1 | 11/2008 | Lee et al. |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,469,049 B1 | 12/2008 | Feng |
| 7,471,581 B2 | 12/2008 | Tran et al. |
| 7,483,319 B2 | 1/2009 | Brown |
| 7,487,329 B2 | 2/2009 | Hepkin et al. |
| 7,487,394 B2 | 2/2009 | Forhan et al. |
| 7,492,641 B2 | 2/2009 | Hosono et al. |
| 7,508,710 B2 | 3/2009 | Mokhlesi |
| 7,526,711 B2 | 4/2009 | Orio |
| 7,539,061 B2 | 5/2009 | Lee |
| 7,539,062 B2 | 5/2009 | Doyle |
| 7,551,492 B2 | 6/2009 | Kim |
| 7,558,109 B2 | 7/2009 | Brandman et al. |
| 7,558,839 B1 | 7/2009 | McGovern |
| 7,568,135 B2 | 7/2009 | Cornwell et al. |
| 7,570,520 B2 | 8/2009 | Kamei et al. |

| | | | | | | |
|---|---|---|---|---|---|---|
| 7,574,555 B2 | 8/2009 | Porat et al. | | 2006/0028877 A1 | 2/2006 | Meir |
| 7,590,002 B2 | 9/2009 | Mokhlesi et al. | | 2006/0101193 A1 | 5/2006 | Murin |
| 7,593,259 B2 | 9/2009 | Kim | | 2006/0106972 A1 | 5/2006 | Gorobets et al. |
| 7,594,093 B1 | 9/2009 | Kancherla | | 2006/0107136 A1 | 5/2006 | Gongwer et al. |
| 7,596,707 B1 | 9/2009 | Vemula | | 2006/0129750 A1 | 6/2006 | Lee et al. |
| 7,609,787 B2 | 10/2009 | Jahan et al. | | 2006/0133141 A1 | 6/2006 | Gorobets |
| 7,613,043 B2 | 11/2009 | Cornwell et al. | | 2006/0156189 A1 | 7/2006 | Tomlin |
| 7,616,498 B2 | 11/2009 | Mokhlesi et al. | | 2006/0179334 A1 | 8/2006 | Brittain et al. |
| 7,619,918 B2 | 11/2009 | Aritome | | 2006/0190699 A1 | 8/2006 | Lee |
| 7,631,245 B2 | 12/2009 | Lasser | | 2006/0203546 A1 | 9/2006 | Lasser |
| 7,633,798 B2 | 12/2009 | Sarin et al. | | 2006/0218359 A1 | 9/2006 | Sanders et al. |
| 7,633,802 B2 | 12/2009 | Mokhlesi | | 2006/0221692 A1 | 10/2006 | Chen |
| 7,639,532 B2 | 12/2009 | Roohparvar et al. | | 2006/0221705 A1 | 10/2006 | Hemink et al. |
| 7,644,347 B2 | 1/2010 | Alexander et al. | | 2006/0221714 A1 | 10/2006 | Li et al. |
| 7,656,734 B2 | 2/2010 | Thorp et al. | | 2006/0239077 A1 | 10/2006 | Park et al. |
| 7,660,158 B2 | 2/2010 | Aritome | | 2006/0239081 A1 | 10/2006 | Roohparvar |
| 7,660,183 B2 | 2/2010 | Ware et al. | | 2006/0256620 A1 | 11/2006 | Nguyen et al. |
| 7,661,000 B2 | 2/2010 | Ueda et al. | | 2006/0256626 A1 | 11/2006 | Werner et al. |
| 7,661,054 B2 | 2/2010 | Huffman et al. | | 2006/0256891 A1 | 11/2006 | Yuan et al. |
| 7,665,007 B2 | 2/2010 | Yang et al. | | 2006/0271748 A1 | 11/2006 | Jain et al. |
| 7,680,987 B1 | 3/2010 | Clark et al. | | 2006/0285392 A1 | 12/2006 | Incarnati et al. |
| 7,733,712 B1 | 6/2010 | Walston et al. | | 2006/0285396 A1 | 12/2006 | Ha |
| 7,742,351 B2 | 6/2010 | Inoue et al. | | 2007/0006013 A1 | 1/2007 | Moshayedi et al. |
| 7,761,624 B2 | 7/2010 | Karamcheti et al. | | 2007/0019481 A1 | 1/2007 | Park |
| 7,797,609 B2 | 9/2010 | Neuman | | 2007/0033581 A1 | 2/2007 | Tomlin et al. |
| 7,810,017 B2 | 10/2010 | Radke | | 2007/0047314 A1 | 3/2007 | Goda et al. |
| 7,848,149 B2 | 12/2010 | Gonzalez et al. | | 2007/0047326 A1 | 3/2007 | Nguyen et al. |
| 7,869,273 B2 | 1/2011 | Lee et al. | | 2007/0050536 A1 | 3/2007 | Kolokowsky |
| 7,885,119 B2 | 2/2011 | Li | | 2007/0058446 A1 | 3/2007 | Hwang et al. |
| 7,904,783 B2 | 3/2011 | Brandman et al. | | 2007/0061502 A1 | 3/2007 | Lasser et al. |
| 7,928,497 B2 | 4/2011 | Yaegashi | | 2007/0067667 A1 | 3/2007 | Ikeuchi et al. |
| 7,929,549 B1 | 4/2011 | Talbot | | 2007/0074093 A1 | 3/2007 | Lasser |
| 7,930,515 B2 | 4/2011 | Gupta et al. | | 2007/0086239 A1 | 4/2007 | Litsyn et al. |
| 7,945,825 B2 | 5/2011 | Cohen et al. | | 2007/0086260 A1 | 4/2007 | Sinclair |
| 7,978,516 B2 | 7/2011 | Olbrich et al. | | 2007/0089034 A1 | 4/2007 | Litsyn et al. |
| 8,014,094 B1 | 9/2011 | Jin | | 2007/0091677 A1 | 4/2007 | Lasser et al. |
| 8,037,380 B2 | 10/2011 | Cagno et al. | | 2007/0091694 A1 | 4/2007 | Lee et al. |
| 8,040,744 B2 | 10/2011 | Gorobets et al. | | 2007/0103978 A1 | 5/2007 | Conley et al. |
| 8,065,583 B2 | 11/2011 | Radke | | 2007/0103983 A1 | 5/2007 | Chen |
| 2001/0002172 A1 | 5/2001 | Tanaka et al. | | 2007/0104211 A1 | 5/2007 | Opsasnick |
| 2001/0006479 A1 | 7/2001 | Ikehashi et al. | | 2007/0109845 A1 | 5/2007 | Chen |
| 2002/0032843 A1* | 3/2002 | Lofgren et al. ............ 711/154 | | 2007/0109849 A1 | 5/2007 | Chen |
| 2002/0038440 A1 | 3/2002 | Barkan | | 2007/0115726 A1 | 5/2007 | Cohen et al. |
| 2002/0056064 A1 | 5/2002 | Kidorf et al. | | 2007/0118713 A1 | 5/2007 | Guterman et al. |
| 2002/0118574 A1 | 8/2002 | Gongwer et al. | | 2007/0143378 A1 | 6/2007 | Gorobets |
| 2002/0133684 A1 | 9/2002 | Anderson | | 2007/0143531 A1 | 6/2007 | Atri |
| 2002/0166091 A1 | 11/2002 | Kidorf et al. | | 2007/0159889 A1 | 7/2007 | Kang et al. |
| 2002/0174295 A1 | 11/2002 | Ulrich et al. | | 2007/0159892 A1 | 7/2007 | Kang et al. |
| 2002/0196510 A1 | 12/2002 | Hietala et al. | | 2007/0159907 A1 | 7/2007 | Kwak |
| 2003/0002348 A1 | 1/2003 | Chen et al. | | 2007/0168837 A1 | 7/2007 | Murin |
| 2003/0103400 A1 | 6/2003 | Van Tran | | 2007/0171714 A1 | 7/2007 | Wu et al. |
| 2003/0161183 A1 | 8/2003 | Van Tran | | 2007/0183210 A1 | 8/2007 | Choi et al. |
| 2003/0189856 A1 | 10/2003 | Cho et al. | | 2007/0189073 A1 | 8/2007 | Aritome |
| 2004/0057265 A1 | 3/2004 | Mirabel et al. | | 2007/0195602 A1 | 8/2007 | Fong et al. |
| 2004/0057285 A1 | 3/2004 | Cernea et al. | | 2007/0206426 A1 | 9/2007 | Mokhlesi |
| 2004/0083333 A1 | 4/2004 | Chang et al. | | 2007/0208904 A1 | 9/2007 | Hsieh et al. |
| 2004/0083334 A1 | 4/2004 | Chang et al. | | 2007/0226599 A1 | 9/2007 | Motwani |
| 2004/0105311 A1 | 6/2004 | Cernea et al. | | 2007/0236990 A1 | 10/2007 | Aritome |
| 2004/0114437 A1 | 6/2004 | Li | | 2007/0253249 A1 | 11/2007 | Kang et al. |
| 2004/0160842 A1 | 8/2004 | Fukiage | | 2007/0256620 A1 | 11/2007 | Viggiano et al. |
| 2004/0223371 A1 | 11/2004 | Roohparvar | | 2007/0263455 A1 | 11/2007 | Cornwell et al. |
| 2005/0007802 A1 | 1/2005 | Gerpheide | | 2007/0266232 A1 | 11/2007 | Rodgers et al. |
| 2005/0013165 A1 | 1/2005 | Ban | | 2007/0271424 A1 | 11/2007 | Lee et al. |
| 2005/0024941 A1 | 2/2005 | Lasser et al. | | 2007/0280000 A1 | 12/2007 | Fujiu et al. |
| 2005/0024978 A1 | 2/2005 | Ronen | | 2007/0291571 A1 | 12/2007 | Balasundaram |
| 2005/0030788 A1 | 2/2005 | Parkinson et al. | | 2007/0297234 A1 | 12/2007 | Cernea et al. |
| 2005/0086574 A1 | 4/2005 | Fackenthal | | 2008/0010395 A1 | 1/2008 | Mylly et al. |
| 2005/0121436 A1 | 6/2005 | Kamitani et al. | | 2008/0025121 A1 | 1/2008 | Tanzawa |
| 2005/0144361 A1 | 6/2005 | Gonzalez et al. | | 2008/0043535 A1 | 2/2008 | Roohparvar |
| 2005/0157555 A1 | 7/2005 | Ono et al. | | 2008/0049504 A1 | 2/2008 | Kasahara et al. |
| 2005/0162913 A1 | 7/2005 | Chen | | 2008/0049506 A1 | 2/2008 | Guterman |
| 2005/0169051 A1 | 8/2005 | Khalid et al. | | 2008/0052446 A1 | 2/2008 | Lasser et al. |
| 2005/0189649 A1 | 9/2005 | Maruyama et al. | | 2008/0055993 A1 | 3/2008 | Lee |
| 2005/0213393 A1 | 9/2005 | Lasser | | 2008/0080243 A1 | 4/2008 | Edahiro et al. |
| 2005/0224853 A1 | 10/2005 | Ohkawa | | 2008/0082730 A1 | 4/2008 | Kim et al. |
| 2005/0240745 A1 | 10/2005 | Iyer et al. | | 2008/0089123 A1 | 4/2008 | Chae et al. |
| 2005/0243626 A1 | 11/2005 | Ronen | | 2008/0104309 A1 | 5/2008 | Cheon et al. |
| 2006/0004952 A1 | 1/2006 | Lasser | | 2008/0104312 A1 | 5/2008 | Lasser |
| 2006/0028875 A1 | 2/2006 | Avraham et al. | | 2008/0109590 A1 | 5/2008 | Jung et al. |

| | | |
|---|---|---|
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0217598 A1 | 9/2008 | Dombroski |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0240872 A1 | 9/2009 | Perlmutter et al. |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0064098 A1* | 3/2010 | Lofgren et al. ............... 711/103 |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0211803 A1 | 8/2010 | Lablans |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | WO2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072103 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | WO 2009072104 A2 | 6/2009 |
| WO | 2009095902 A2 | 8/2009 |
| WO | 2011024015 A1 | 3/2011 |

OTHER PUBLICATIONS

U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 03, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic No. Wrong" in SD", Free Online Articles Director Article Base, posted Sep. 5, 2009.
UBUNTU Forums, "Memory Stick Failed IO Superblock", posted Nov. 11, 2009.
Super User Forums, "SD Card Failure, can't read superblock", posted Aug. 8, 2010.
U.S. Appl. No. 12/987,174 "Redundant Data Storage in Multi-Die Memory Systems", filed on Jan. 10, 2011.
U.S. Appl. No. 12/987,175 "Redundant Data Storage Schemes for Multi-Die Memory Systems" filed on Jan. 10, 2011.

U.S. Appl. No. 12/963,649 "Memory Management Schemes for Non-Volatile Memory Devices" filed on Dec. 9, 2010.
U.S. Appl. No. 13/021,754 "Reducing Peak Current in Memory Systems" filed on Feb. 6, 2011.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
Wei, L., "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-55, 2007.
JEDEC Standard JESD84-C44, "Embedded MultiMediaCard (e•MMC) Mechanical Standard, with Optional Reset Signal", Jedec Solid State Technology Association, USA, Jul. 2009.
JEDEC, "UFS Specification", version 0.1, Nov. 11, 2009.
SD Group and SD Card Association, "SD Specifications Part 1 Physical Layer Specification", version 3.01, draft 1.00, Nov. 9, 2009.
COMPAQ et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
US 7,161,836, 01/2007, Wan et al. (withdrawn).

Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed on Jun. 24, 2010.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2009.
SAS Protocol, "Information Technology—Serial Attached SCSI—2 (SAS-2)", INCITS document T10/1760-D, revision 15a, Feb. 22, 2009.
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May, 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), p. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in Flash", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.
Han et al., "An Intelligent Garbage Collection Algorithm for Flash Memory Storages", Computational Science and its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, p. 103-112, Springer Berlin / Heidelberg, Aug. 25, 2006.
Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Takeuchi et al., "A Multipage Cell Architecture for High-Speed Programming Multilevel NAND Flash Memories", IEEE Journal of Solid State Circuits, vol. 33, No. 8, Aug. 1998.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

U.S. Appl. No. 11/949,135 Official Action dated Oct. 2, 2009.

U.S. Appl. No. 12/019,011 Official Action dated Nov. 20, 2009.

Sommer, N., U.S. Appl. No. 12/171,797 "Memory Device with Non-Uniform Programming Levels" filed on Jul. 11, 2008.

Shalvi et al., U.S. Appl. No. 12/251,471 "Compensation for Voltage Drifts in Analog Memory Cells" filed on Oct. 15, 2008.

Sommer et al., U.S. Appl. No. 12/497,707 "Data Storage in Analog Memory Cells with Protection Against Programming Interruption" filed on Jul. 6, 2009.

Winter et al., U.S. Appl. No. 12/534,893 "Improved Data Storage in Analog Memory Cells Using Modified Pass Voltages" filed on Aug. 4, 2009.

Winter et al., U.S. Appl. No. 12/534,898 "Data Storage Using Modified Voltages" filed on Aug. 4, 2009.

Shalvi et al., U.S. Appl. No. 12/551,583 "Segmented Data Storage" filed on Sep. 1, 2009.

Shalvi et al., U.S. Appl. No. 12/551,567 "Reliable Data Storage in Analog Memory Cells Subjected to Long Retention Periods" filed on Sep. 1, 2009.

Perlmutter et al., U.S. Appl. No. 12/558,528 "Estimation of Memory Cell Read Thresholds by Sampling Inside Programming Level Distribution Intervals" filed on Sep 13, 2009.

Sokolov, D., U.S. Appl. No. 12/579,430 "Efficient Programming of Analog Memory Cell Devices" filed on Oct 15, 2009.

Shalvi, O., U.S. Appl. No. 12/579,432 "Efficient Data Storage in Storage Device Arrays" filed on Oct 15, 2009.

Sommer et al., U.S. Appl. No. 12/607,078 "Data Scrambling in Memory Devices" filed on Oct 28, 2009.

Sommer et al., U.S. Appl. No. 12/607,085 "Data Scrambling Schemes for Memory Devices" filed on Oct 28, 2009.

Shalvi et al., U.S. Appl. No. 12/618,732 "Storage at M Bits/Cell Density in N Bits/Cell Analog Memory Cell Devices, M>N" filed on Nov. 15, 2009.

Sommer et al., U.S. Appl. No. 12/649,358 "Efficient Readout Schemes for Analog Memory Cell Devices" filed on Dec. 30, 2009.

Sommer et al., U.S. Appl. No. 12/649,360 "Efficient Readout Schemes for Analog Memory Cell Devices Using Multiple Read Threshold Sets" filed on Dec. 30, 2009.

Rotbard et al., U.S. Appl. No. 12/649,382 "Rejuvenation of Analog Memory Cells" filed on Dec. 30, 2009.

Shachar et al., U.S. Appl. No. 12/688,883 "Hierarchical data storage system" filed on Jan. 17, 2010.

Shalvi, O., U.S. Appl. No. 12/758,044 "Memory device with negative thresholds" filed on Apr. 12, 2010.

Sokolov et al., U.S. Appl. No. 12/714,501 "Selective Activation of Programming Schemes in Analog Memory Cell Arrays" filed on Feb. 28, 2010.

Sokolov et al., U.S. Appl. No. 12/728,287 "Use of host system resources by memory controller" filed on Mar. 22, 2010.

Sommer et al., U.S. Appl. No. 12/728,296 "Database of Memory Read Thresholds" filed on Mar. 22, 2010.

Sommer et al., U.S. Appl. No. 12/758,003 "Selective re-programming of analog memory cells" filed on Apr. 11, 2010.

U.S. Appl. No. 12/880,101 "Reuse of Host Hibernation Storage Space by Memory Controller", filed on Sep. 12, 2010.

U.S. Appl. No. 12/890,724 "Error Correction Coding Over Multiple Memory pp.", filed on Sep. 27, 2010.

U.S. Appl. No. 12/171,797 Official Action dated Aug. 25, 2010.

U.S. Appl. No. 12/497,707 Official Action dated Sep. 15, 2010.

U.S. Appl. No. 11/995,801 Official Action dated Oct. 15, 2010.

Numonyx, "M25PE16: 16-Mbit, p.-erasable serial flash memory with byte-alterability, 75 MHz SPI bus, standard pinout", Apr. 2008.

* cited by examiner

OPTIMIZED SELECTION OF MEMORY CHIPS IN MULTI-CHIPS MEMORY DEVICES

FIELD OF THE INVENTION

The present invention relates generally to memory devices, and particularly to memory devices that include multiple memory units.

BACKGROUND OF THE INVENTION

Some memory devices and products are fabricated from multiple memory units. For example, some memory devices are fabricated by assembling multiple memory dies in a Multi-Chip Package (MCP). Solid State Disks (SSDs), media players and other products sometimes comprise multiple memory units. Hard Disk Drives (HDDs) sometimes comprise multiple individual magnetic disks.

The storage capacities of individual memory units in a given device may differ from one unit to another. For example, U.S. Pat. No. 6,363,008, whose disclosure is incorporated herein by reference, describes a multiple-bit-per-cell memory, which includes multiple memory arrays. The number of bits stored per cell is set separately for each of the memory arrays. Memory arrays that testing proves are accurate when writing, storing, and reading a larger number of bits per cell are set to store more bits per cell, and memory arrays that cannot accurately write, store, or read as many bits per cell are set to store fewer bits per cell.

PCT International Publication WO 2007/132456, whose disclosure is incorporated herein by reference, describes a method for data storage in a memory that includes a plurality of analog memory cells. The method includes estimating respective achievable storage capacities of the analog memory cells. The memory cells are then assigned respective storage configurations defining quantities of data to be stored in the memory cells based on the estimated achievable capacities. The data is stored in the memory cells in accordance with the respective assigned storage configurations. The achievable storage capacities of the analog memory cells are re-estimated after the memory has been installed in a host system and used for storing the data in the host system. The storage configurations are modified responsively to the re-estimated achievable capacities.

SUMMARY OF THE INVENTION

An embodiment of the present invention provides a method, including: accepting a definition of a type of multi-unit memory device that includes a set of memory units, each having a respective nominal storage capacity, the definition specifying a target memory size of the multi-unit memory device such that a sum of nominal storage capacities of the memory units in the set is equal to the target memory size;

accepting a plurality of the memory units having respective actual storage capacities, at least some of which differ from the respective nominal storage capacity; and assembling multi-unit memory devices including respective sets of the memory units in accordance with the definition, such that at least one of the sets includes at least a first memory unit having a first actual storage capacity that is less than the respective nominal storage capacity and at least a second memory unit having a second actual storage capacity that is greater than the nominal storage capacity.

In some embodiments, assembling the multi-unit memory devices includes accepting capacity indications, which are indicative of the respective actual storage capacities of the memory units, and selecting the sets of the memory units responsively to the capacity indications. Additionally or alternatively, assembling the multi-unit memory devices includes selecting the sets of the memory units such that the actual storage capacities of the memory units in each of the sets meet a predefined criterion. In an embodiment, the criterion specifies that a sum of the actual storage capacities of the memory units in any of the sets is no less than the target memory size. In another embodiment, the criterion specifies that a sum of the actual storage capacities of the memory units in any of the sets does not exceed the target memory size by more than a predefined value.

In a disclosed embodiment, selecting the sets includes selecting a given set by assigning to the given set a given memory unit, which has a largest actual storage capacity among the memory units that have not yet been assigned to any of the sets, and further assigning to the set an additional memory unit, which has a smallest actual storage capacity among the memory units that have not yet been assigned to any of the sets and such that a sum of the actual storage capacities of the memory units in the given set, including the given memory unit and the additional memory unit, meet the predefined criterion. In another embodiment, selecting the sets includes storing in at least some of the memory units information indicating an affiliation of the memory units with the sets, and assembling the multi-unit memory devices includes retrieving the information from the memory units and assembling the memory devices from the respective sets responsively to the retrieved information.

In yet another embodiment, the memory units include at least one unit type selected from a group of types consisting of unpackaged memory dies, packaged memory Integrated Circuits (ICs) and magnetic disks. In some embodiments, the memory units include the unpackaged memory dies, and the multi-unit memory device includes a Multi-Chip Package (MCP). In an embodiment, the definition further specifies a number of the memory units in the multi-unit memory device, the first actual storage capacity is less than the target memory size divided by the specified number of the memory units by no more than 20%, and the second actual storage capacity is greater than the target memory size divided by the specified number of the memory units, such that a sum of the actual storage capacities of the memory units in the at least one of the sets is no less than the target memory size.

There is additionally provided, in accordance with an embodiment of the present invention, a method, including:

accepting a definition of a type of multi-unit memory device that includes a set of memory units, each having a respective nominal performance level, the definition specifying a target performance level of the multi-unit memory device;

accepting a plurality of the memory units having respective actual performance levels, at least some of which differ from the respective nominal performance levels; and assembling multi-unit memory devices including respective sets of the memory units in accordance with the definition, such that at least one of the sets includes at least a first memory unit having a first actual performance level that is less than the respective nominal performance level and at least a second memory unit having a second actual performance level that is greater than the nominal performance level, so as to cause the multi-unit memory devices to meet the target performance level.

In an embodiment, the target performance level, the nominal performance levels and the actual performance levels include, respectively, a target power consumption of the multi-unit memory device, nominal power consumptions of the respective memory units and actual power consumptions of the respective memory units. In another embodiment, the target performance level, the nominal performance levels and the actual performance levels include, respectively, a target programming speed of the multi-unit memory device, nominal programming speeds of the respective memory units and actual programming speeds of the respective memory units. In yet another embodiment, the target performance level, the nominal performance levels and the actual performance levels include, respectively, a target reading speed of the multi-unit memory device, nominal reading speeds of the respective memory units and actual reading speeds of the respective memory units.

There is also provided, in accordance with an embodiment of the present invention, apparatus, including:

an interface, which is operative to accept a definition of a type of multi-unit memory device that includes a set of memory units, each having a respective nominal storage capacity, the definition specifying a target memory size of the multi-unit memory device such that a sum of nominal storage capacities of the memory units in the set is equal to the target memory size; and a selection/assembly system, which is coupled to accept a plurality of the memory units having respective actual storage capacities, at least some of which differ from the respective nominal storage capacity, and to assemble multi-unit memory devices including respective sets of the memory units in accordance with the definition, such that at least one of the sets includes at least a first memory unit having a first actual storage capacity that is less than the respective nominal storage capacity and at least a second memory unit having a second actual storage capacity that is greater than the nominal storage capacity.

In an embodiment, the selection/assembly system includes:

a selection subsystem, which is coupled to select the sets and to store in at least some of the memory units information indicating an affiliation of the memory units with the sets; and an assembly subsystem, which is coupled to retrieve the information from the memory units and to assemble the memory devices from the respective sets responsively to the retrieved information.

There is further provided, in accordance with an embodiment of the present invention, apparatus, including:

an interface, which is operative to accept a definition of a type of multi-unit memory device that includes a set of memory units, each having a respective nominal performance level, the definition specifying a target performance level of the multi-unit memory device; and a selection/assembly system, which is coupled to accept a plurality of the memory units having respective actual performance levels, at least some of which differ from the respective nominal performance levels, and to assemble multi-unit memory devices including respective sets of the memory units in accordance with the definition, such that at least one of the sets includes at least a first memory unit having a first actual performance level that is less than the respective nominal performance level and at least a second memory unit having a second actual performance level that is greater than the nominal performance level, so as to cause the multi-unit memory devices to meet the target performance level.

There is additionally provided, in accordance with an embodiment of the present invention, a memory device, which has a target storage capacity and includes multiple memory units having respective nominal storage capacities and actual storage capacities, wherein one or more of the actual storage capacities are lower than the respective nominal storage capacities and one or more other actual storage capacities are higher than the respective nominal storage capacities, such that a sum of the actual storage capacities of the multiple memory units is no less than the target storage capacity.

There is also provided, in accordance with an embodiment of the present invention, a memory device, which has a target performance level and includes multiple memory units having respective nominal performance levels and actual performance levels, wherein one or more of the actual performance levels are lower than the respective nominal performance levels and one or more other actual performance levels are higher than the respective nominal performance levels, such that a composite performance level of the memory device meets the target performance level.

There is further provided, in accordance with an embodiment of the present invention, a memory device, which includes a specified number of memory units and has a target memory size, wherein at least one of the memory units has a first actual capacity that is less than the target memory size divided by the specified number of memory units by no more than 20%, and wherein at least one other of the memory units has a second actual capacity that is greater than the target memory size divided by the specified number of units, such that a sum of the actual capacities of the memory units is no less than the target memory size.

The present invention will be more fully understood from the following detailed description of the embodiments thereof, taken together with the drawings in which:

DETAILED DESCRIPTION OF EMBODIMENTS

Overview

Memory devices are sometimes constructed from multiple memory units. For example, an 8 GB memory device may be constructed from four 2 GB memory units. Typically, a memory device has a certain target storage capacity, the memory units have respective nominal storage capacities, and the sum of nominal storage capacities of the memory units in any given memory device is equal to the target capacity of the device.

In many practical cases, however, the actual storage capacity of the memory units deviates from the nominal capacity due to manufacturing defects, process variations or other factors. Because of these statistical variations, the sum of the actual unit capacities in some memory devices may not reach the target capacity of the device. In other devices, the sum of the actual capacities may exceed the target capacity significantly, thus wasting memory resources.

Some known solutions reduce the likelihood of falling short of the target device capacity by designing the individual memory units with sufficient capacity margin. This margin, which usually remains unused in most of the memory devices, unnecessarily increases the cost and size of the memory units. In other known schemes, memory units whose actual capacities fall below the nominal capacity are discarded or downgraded (e.g., a 2 GB unit is classified as a 1 GB unit), thereby reducing yield and increasing manufacturing costs.

Embodiments of the present invention that are described herein provide improved methods and systems for producing memory devices from multiple memory units. The methods and systems described herein measure the actual capacities of the memory units, and automatically select sets of memory units from which the memory devices are to be assembled. The selection of memory units is based on their actual capacities, so that the total capacity of the units in any given memory device will meet or exceed the target capacity of the device.

Typically, a memory unit whose actual capacity is low is grouped in the same set with another unit whose actual storage capacity is higher than the nominal capacity. In some embodiments, the selection process takes into account additional criteria, such as avoiding situations in which the sum of actual capacities exceeds the target device capacity by a large amount.

When using the disclosed methods and systems, memory units having relatively low actual capacities are still usable and need not be discarded or downgraded. Since the disclosed methods can tolerate a certain number of low-capacity memory units, the memory units can be designed with little or no capacity margins. Memory units having relatively high actual capacities are grouped with low-capacity units, so that the overall amount of wasted memory is reduced considerably. In summary, the disclosed techniques provide considerable cost reduction and yield improvement in memory device manufacturing processes.

Although the embodiments described herein mainly refer to selection of sets of memory units having varying storage capacities, the principles of the present invention can also be used for assembling memory devices from memory units that differ from one another in various other performance levels, and in which the overall performance level of the memory device depends on the individual actual performance levels of its memory units. Such performance levels may comprise, for example, power consumption, programming speed or reading speed.

System Description

Figure 1:
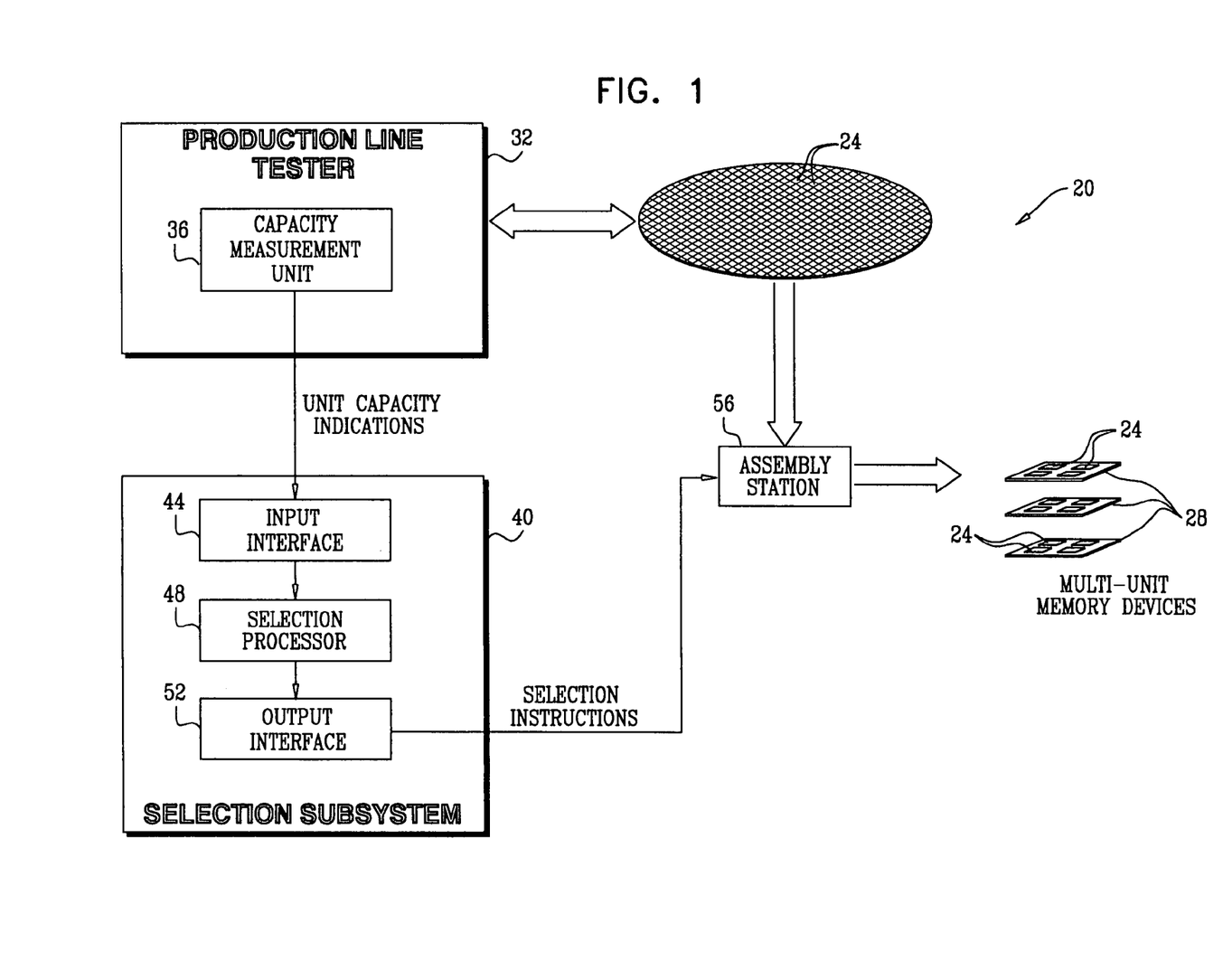
FIG. 1 is a block diagram that schematically illustrates a system for manufacturing memory devices from multiple memory units, in accordance with an embodiment of the present invention.

FIG. 1 is a block diagram that schematically illustrates a system 20 for manufacturing memory devices 28, in accordance with an embodiment of the present invention. Each memory device 28 comprises multiple memory units 24. Such a configuration may be used, for example, in order to reach total storage capacities that are not achievable or expensive using a single memory unit, or for various other reasons.

Memory devices 28 may comprise any suitable device comprising multiple memory units, such as, for example, Multi-Chip Packages (MCPs), each comprising multiple memory dies. Alternatively, device 28 may comprise a Solid State Disk (SSD), a removable storage module, a Multi-Media Card (MMC) or Embedded MMC (eMMC), a Secure Digital (SD) memory card, a media player (e.g., MP3 or MP4 player), a digital camera, a mobile phone or other communication terminal, a mobile computing device or any other product, which comprises multiple packaged or unpackaged memory Integrated Circuits (ICs). Further alternatively, device 28 may comprise a Hard Disk Drive (HDD), which comprises multiple individual disks, or a hybrid HDD-SSD comprising one or more disks and one or more memory dies. Device 28 may comprise any desired number of memory units 24, which may be of the same type or of different types.

Memory units 24 may comprise any suitable type of memory, volatile or non-volatile, digital or analog, such as NAND, NOR and Charge Trap Flash (CTF) Flash cells, Phase Change Memory (PCM), Nitride Read Only Memory (NROM), Ferroelectric Random Access Memory (FRAM), Magnetic RAM (MRAM), Static RAM (SRAM) and Dynamic RAM (DRAM) cells. Device 28 may comprise any desired number of units 24.

Each memory device 28 has a predefined target storage capacity, i.e., a specified amount of data that the device is expected to store. Similarly, each individual memory unit 24 has a specified storage capacity, i.e., an amount of data that the unit is specified to store. (The terms "specified capacity" and "nominal capacity," with regard to the individual memory units, are used interchangeably herein.) The sum of storage capacities of memory units 24 in a given memory device 28 is thus expected to meet or exceed the target storage capacity of the memory device, in order for device 28 to meet its specification. For example, an 8 GB memory device may be fabricated using four 2 GB memory units. Units 24 in a given device 28 may sometimes have different specified capacities, e.g., an 8 GB device may be constructed from one 4 GB unit and two 2 GB units.

In many practical cases, however, the actual storage capacities of units 24 are distributed statistically and thus vary from one unit to another. For example, some of the memory cells in a given memory unit may fail because of manufacturing defects or for any other reason. As a result, the actual storage capacities of some memory units may fall below their specified storage capacities. In such a case, the sum of the storage capacities of units 24 in a given device 28 may fall below the target capacity of the device.

Embodiments of the present invention that are described herein provide methods and systems for producing memory devices from multiple memory units. The methods and systems described herein automatically select sets of memory units 24 based on their actual capacities, so that the total capacity of the units in a given memory device will meet or exceed the target capacity of the device. Typically, units 24 whose actual capacity is low are grouped in the same set with other units 24 whose actual storage capacity is higher than the specified capacity. When a memory device is fabricated using such a set of memory units, the target capacity of the memory device is met.

The description that follows refers to selection of unpackaged memory dies in a production/assembly line of a MCP memory product. In this embodiment, memory units 24 comprise memory dies on a semiconductor wafer. This embodiment, however, is presented purely by way of example. In alternative embodiments, the methods and systems described herein can be used with various other sorts of memory devices and memory units, and at various stages of the manufacturing process.

System 20 comprises a production line tester 32, which applies various tests to memory units 24. In particular, tester 32 comprises a capacity measurement unit 36, which measures the actual storage capacities of the different dies (memory units) on the wafer. The capacity measurement unit produces capacity indications, which are indicative of the actual storage capacities of the memory units. The capacity indications may comprise, for example, measured or estimated values of the memory unit capacities, a classification of the unit capacities into classes (e.g., "low capacity," "standard capacity" and "average capacity"), Boolean flags indicating whether or not the measured capacities meet a certain threshold value, or any other suitable kind of indication. Tester 32 may output the capacity indications over a suitable interface or store them in a suitable data structure. Alternatively, the capacity indication of each memory unit can be stored by tester 32 in one or more memory cells of the unit in question. This technique is applicable when the memory units comprise non-volatile memory, such as Flash memories.

System 20 comprises a selection subsystem 40, which selects sets of units 24 for fabricating memory devices 28. Subsystem 40 selects the sets based on the actual storage capacities of units 24, as represented by the capacity indications provided by tester 32. (Subsystem 40 may receive the capacity indications from tester 32. Alternatively, when tester 32 stores the capacity indications in units 24, subsystem 40 retrieves the indications from the memory units.)

The sets are selected so that the sum of actual storage capacities of units 24 in a given device 28 will not fall below the target capacity of the device. The selection criteria may also take into account other constraints, as will be described below. Typically, a given set of units 24 that is selected by subsystem 40 comprises at least one unit whose actual storage capacity is lower than its specified storage capacity, and at least one unit 24 whose actual storage capacity is higher than its specified storage capacity.

Thus, units 24 whose actual storage capacity falls below the specified capacity need not be discarded or downgraded, and can still be used to fabricate devices 28. The lower storage capacity of these units is compensated for by matching them with other units 24, whose actual storage capacity is higher than the specified storage capacity.

Subsystem 40 comprises an input interface 44 for receiving the capacity indications, a selection processor 48 for carrying out the selection methods described herein, and an output interface 52 for reporting the selected sets of memory units. Typically, processor 48 comprises a general-purpose computer, which is programmed in software to carry out the functions described herein. The software may be downloaded to the computer in electronic form, over a network, for example, or it may, alternatively or additionally, be provided and/or stored on tangible media, such as magnetic, optical, or electronic memory.

In some embodiments, processor 48 outputs, via interface 52, selection instructions that indicate which of units 24 are to be grouped together in order to fabricate devices 28. The selection instructions (or other indication of the sets of units 24 selected by subsystem 40) are provided to an assembly station 56. The assembly station assembles each memory device 28 from one of the sets of units 24 indicated by subsystem 40. (In some embodiments, the assembly station assembles devices 28 from packaged memory units. The packaging process, as well as other parts of the manufacturing/assembly process that are not essential for demonstrating the disclosed methods, is omitted from this description for the sake of clarity.)

In FIG. 1, the selection instructions are sent from the selection subsystem to the assembly station over a suitable interface. Alternatively, e.g., when the memory units comprise non-volatile memory, the selection instructions can be stored in the memory units and retrieved by the assembly station. For example, the selection subsystem may store in each unit 24 an identifier, which indicates the set to which the unit belongs. The assembly station can then read the identifiers from units 24 and assemble each device 28 from units 24 having matching identifiers.

Constructing Memory Devices from Multiple Memory Units having Different Actual Capacities The actual storage capacities of memory units 24 are typically distributed statistically over a certain range. The storage capacity may vary from one memory unit to another because of, for example, manufacturing defects that cause some of the memory cells to be defective high levels of distortion in some of the memory cells, or any other reason. For example, for memory units whose specified capacity is 2 GB, the actual capacities may be distributed between 1.8 and 2.2 GB. Consider, for example, a memory device that is specified as a 4 GB device, and which is constructed from two memory units whose specified capacity is 2 GB.

If memory units 24 are paired arbitrarily, there is a high likelihood that the sum of two actual capacities will fall below the 4 GB target capacity. In such a case, device 28 will not reach its target capacity. There is also high likelihood that the sum of actual unit capacities with be much higher than the target capacity of the device, thus unnecessarily wasting memory resources. On the other hand, when units 24 are selected and grouped based on their actual capacities, the above-mentioned undesirable situations can be avoided.

Typically, selection processor 48 accepts a definition of the type of memory device 28, i.e., a definition that specifies the number of individual memory units 24 that are used for assembling each device 28, and the respective nominal (specified) capacities of these units. Based on this definition, selection processor 48 may apply various selection criteria to the capacity indications in order to properly select sets of memory units. Typically, the sets are selected so that the sum of actual capacities in any device 28 meets or exceeds the target capacity of the device. In addition, processor 48 may attempt to minimize excess memory, i.e., to avoid situations in which the sum of actual capacities is considerably larger than the target capacity of the device. Excess memory is usually caused by memory units whose actual capacities are considerably larger than the specified capacity. Often, such units are better utilized by matching them with units whose actual capacity is especially low. Thus, in some embodiments, processor 48 selects the sets of memory units such that the sum of actual capacities in any given set does not exceed the target device capacity by more than a predefined value.

Consider a memory device comprising two memory units. In an example selection process, processor 48 sorts a given collection of memory units according to their actual capacities. Then, the processor runs an iterative selection process. In a given iteration, the processor selects the highest-capacity unit that was not yet selected. The processor pairs this unit with the lowest-capacity unit that has not yet been selected, and which still enables the sum of actual capacities of the two units to meet the target capacity of the device (and/or meet any other suitable criterion). Alternatively, any other suitable selection process or criteria can be used.

As noted above, the memory unit storage capacities may vary because of manufacturing defects or high distortion levels (which may be mitigated, for example, by using low-rate error correction codes or by reducing the number of programming levels assigned to the distorted cells, possibly after a certain number of programming and erasure cycles).

Figure 2:
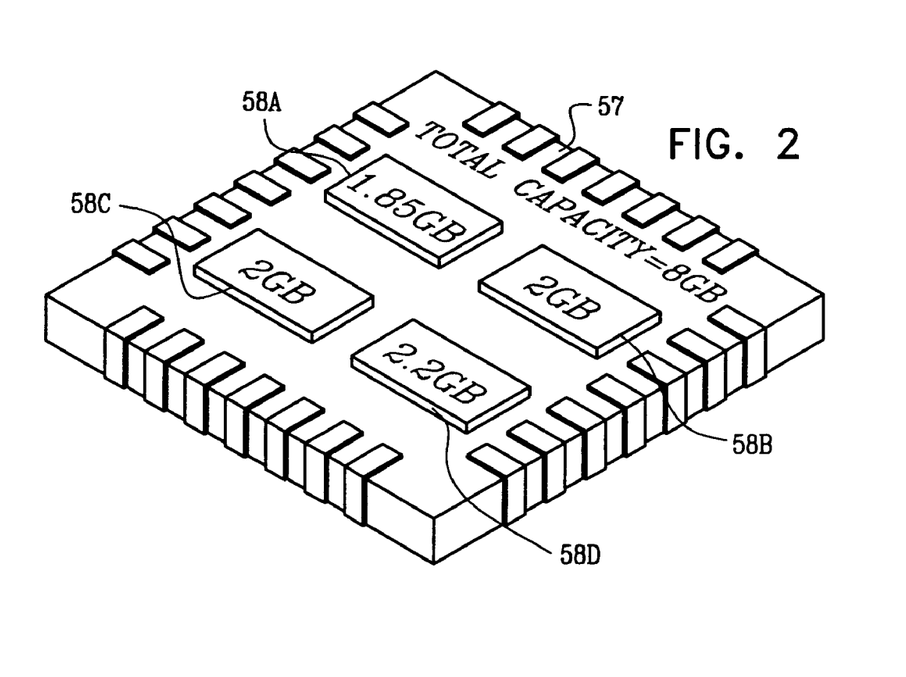
FIG. 2 is a diagram that schematically illustrates a memory device from multiple memory units, in accordance with an embodiment of the present invention.

FIG. 2 is a diagram that schematically illustrates a memory device 57 comprising four memory units 58A . . . 58D, which was fabricated using the disclosed methods, in accordance with an embodiment of the present invention. In this example, the target capacity of device 57 is 8 GB, and the specified capacity of units 58A . . . 58D is 2 GB. In the specific device shown in FIG. 2, however, the actual capacities of the memory units deviate from their specified capacities. The actual capacities of units 58B and 58C is 2 GB. The actual capacity of unit 58A, however, is only 1.85 GB, smaller than the specified capacity. In order to compensate for this smaller capacity, the fourth memory unit of this device, unit 58D, has an actual capacity of 2.2 GB, higher than the specified capacity. The four memory units were selected so that the sum of their actual capacities (8.05 GB) meets or slightly exceeds the 8 GB target capacity of device 57.

Note that the features of the disclosed methods and systems can be formulated irrespective of any nominal storage capacity of the individual memory units. In some embodiments of the present invention, memory device 57 has a target memory size and a pre-specified number of memory units. At least one of the memory units in device 57 has an actual capacity that is lower than the target memory size divided by the specified number of memory units (usually by no more than 20%). At least one other memory unit in the device has an actual storage capacity that is higher than the target memory size divided by the specified number of memory units. The memory units are selected so that the total sum of actual storage capacities is no less than the target memory size of the device.

Figure 3:
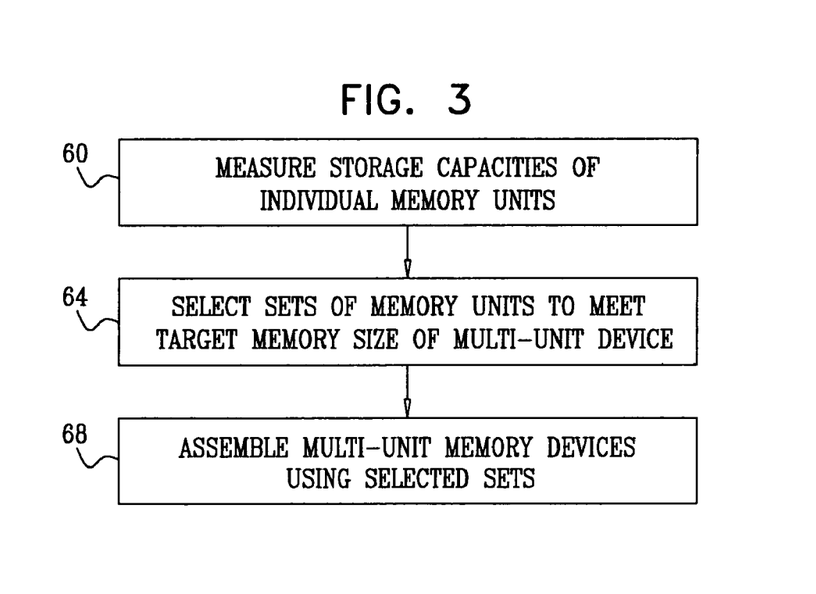
FIG. 3 is a flow chart that schematically illustrates a method for manufacturing memory devices from multiple memory units, in accordance with an embodiment of the present invention.

FIG. 3 is a flow chart that schematically illustrates a method for manufacturing memory devices from multiple memory units, in accordance with an embodiment of the present invention. The method begins with capacity measurement unit 36 measuring the actual capacities of memory units 24, at a capacity measurement step 60. Unit 36 produces capacity indications corresponding to the different units, and provides the indications to selection processor 48 (either directly or by storing them in units 24).

Selection processor 48 selects, based on the capacity indications, sets of units 24 from which to construct devices 28 at a selection step 64. Processor 48 may apply any suitable rules or criteria to the capacities in order to select the sets of units, such as the criteria described above. Processor 48 issues selection instructions, which are provided to assembly station 56.

The assembly station constructs memory devices 28 from the sets of units 24 selected by processor 48, at an assembly step 68. Since memory units 24 in each device 28 are selected based on their actual capacities, devices 28 are able to meet their specified target capacities without unnecessary waste of memory resources. The number of units 24 that are discarded or downgraded because of low actual capacity is minimized.

When storing data in memory devices constructed from units having different capacities, the data storage and retrieval scheme should often take into account the different capacities of the different units. Some aspects of storing data in memory units having different capacities are described in PCT International Publication WO 2007/132456, cited above. Alternatively, any other suitable scheme can be used.

The embodiments described herein mainly address a configuration comprising a tester, a selection subsystem and an assembly station. The principles of the present invention are, however, not limited to this specific partitioning. In alternative embodiments, the functions of these three units can be implemented in a single unit or divided among multiple units, as desired. In other words, the tester, selection subsystem and assembly station are regarded herein collectively as a selection/assembly system, which selects sets of memory units and assembles multi-unit memory devices accordingly. The functions of the selection/assembly system may be partitioned into any desired number and types of subsystems.

Although the embodiments described herein mainly address selection of sets of memory units having varying storage capacities, the principles of the present invention can also be used for assembling memory devices from memory units that differ from one another in various other performance levels, and in which the overall composite performance level of the memory device depends on the individual actual performance levels of its memory units.

For example, the individual memory units may have power consumption levels that vary from one unit to another. The composite (e.g., average or maximum) power consumption of the memory device depends on the actual power consumptions of the individual memory units from which it is assembled. Thus, the methods and systems described herein can be used to specify a target power consumption for the memory devices, to measure the actual power consumptions of the memory units, and then to select sets of memory units for assembling the memory devices, such that the composite power consumption of each device meets the specified target power consumption level. In alternative embodiments, the performance level on which the selection is based may comprise a programming speed, a reading speed, or any other suitable performance level.

It will thus be appreciated that the embodiments described above are cited by way of example, and that the present invention is not limited to what has been particularly shown an& described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method, comprising:
   accepting a definition of a type of multi-unit memory device that comprises a set of memory units, each having a respective nominal storage capacity, the definition specifying a target memory size of the multi-unit memory device such that a sum of nominal storage capacities of the memory units in the set is equal to the target memory size;
   accepting a plurality of the memory units having respective actual storage capacities, at least some of which differ from the respective nominal storage capacity; and
   assembling multi-unit memory devices comprising respective sets of the memory units in accordance with the definition, such that at least one of the sets comprises at least a first memory unit having a first actual storage capacity that is less than the respective nominal storage capacity and at least a second memory unit having a second actual storage capacity that is greater than the nominal storage capacity.

2. The method according to claim 1, wherein assembling the multi-unit memory devices comprises accepting capacity indications, which are indicative of the respective actual storage capacities of the memory units, and selecting the sets of the memory units responsively to the capacity indications.

3. The method according to claim 1, wherein assembling the multi-unit memory devices comprises selecting the sets of the memory units such that the actual storage capacities of the memory units in each of the sets meet a predefined criterion.

4. The method according to claim 3, wherein the criterion specifies that a sum of the actual storage capacities of the memory units in any of the sets is no less than the target memory size.

5. The method according to claim 3, wherein the criterion specifies that a sum of the actual storage capacities of the memory units in any of the sets does not exceed the target memory size by more than a predefined value.

6. The method according to claim 3, wherein selecting the sets comprises selecting a given set by assigning to the given set a given memory unit, which has a largest actual storage capacity among the memory units that have not yet been assigned to any of the sets, and further assigning to the set an additional memory unit, which has a smallest actual storage capacity among the memory units that have not yet been assigned to any of the sets and such that a sum of the actual storage capacities of the memory units in the given set, including the given memory unit and the additional memory unit, meet the predefined criterion.

7. The method according to claim 3, wherein selecting the sets comprises storing in at least some of the memory units information indicating an affiliation of the memory units with the sets, and wherein assembling the multi-unit memory devices comprises retrieving the information from the memory units and assembling the memory devices from the respective sets responsively to the retrieved information.

8. The method according to claim 1, wherein the memory units comprise at least one unit type selected from a group of types consisting of unpackaged memory dies, packaged memory Integrated Circuits (ICs) and magnetic disks.

9. The method according to claim 8, wherein the memory units comprise the unpackaged memory dies, and wherein the multi-unit memory device comprises a Multi-Chip Package (MCP).

10. The method according to claim 1, wherein the definition further specifies a number of the memory units in the multi-unit memory device, wherein the first actual storage capacity is less than the target memory size divided by the specified number of the memory units by no more than 20%, and wherein the second actual storage capacity is greater than the target memory size divided by the specified number of the memory units, such that a sum of the actual storage capacities of the memory units in the at least one of the sets is no less than the target memory size.

11. A method, comprising:
accepting a definition of a type of multi-unit memory device that comprises a set of memory units, each having a respective nominal performance level, the definition specifying a target performance level of the multi-unit memory device;
accepting a plurality of the memory units having respective actual performance levels, at least some of which differ from the respective nominal performance levels; and
assembling multi-unit memory devices comprising respective sets of the memory units in accordance with the definition, such that at least one of the sets comprises at least a first memory unit having a first actual performance level that is less than the respective nominal performance level and at least a second memory unit having a second actual performance level that is greater than the nominal performance level, so as to cause the multi-unit memory devices to meet the target performance level.

12. The method according to claim 11, wherein the target performance level, the nominal performance levels and the actual performance levels comprise, respectively, a target power consumption of the multi-unit memory device, nominal power consumptions of the respective memory units and actual power consumptions of the respective memory units.

13. The method according to claim 11, wherein the target performance level, the nominal performance levels and the actual performance levels comprise, respectively, a target programming speed of the multi-unit memory device, nominal programming speeds of the respective memory units and actual programming speeds of the respective memory units.

14. The method according to claim 11, wherein the target performance level, the nominal performance levels and the actual performance levels comprise, respectively, a target reading speed of the multi-unit memory device, nominal reading speeds of the respective memory units and actual reading speeds of the respective memory units.

15. Apparatus, comprising:
an interface, which is operative to accept a definition of a type of multi-unit memory device that comprises a set of memory units, each having a respective nominal storage capacity, the definition specifying a target memory size of the multi-unit memory device such that a sum of nominal storage capacities of the memory units in the set is equal to the target memory size; and
a selection/assembly system, which is coupled to accept a plurality of the memory units having respective actual storage capacities, at least some of which differ from the respective nominal storage capacity, and to assemble multi-unit memory devices comprising respective sets of the memory units in accordance with the definition, such that at least one of the sets comprises at least a first memory unit having a first actual storage capacity that is less than the respective nominal storage capacity and at least a second memory unit having a second actual storage capacity that is greater than the nominal storage capacity.

16. The apparatus according to claim 15, wherein the interface is operative to accept capacity indications, which are indicative of the respective actual storage capacities of the memory units, and wherein the selection/assembly system is coupled to select the sets of the memory units responsively to the capacity indications.

17. The apparatus according to claim 15, wherein the selection/assembly system is coupled to select the sets of the memory units such that the actual storage capacities of the memory units in each of the sets meet a predefined criterion.

18. The apparatus according to claim 17, wherein the criterion specifies that a sum of the actual storage capacities of the memory units in any of the sets is no less than the target memory size.

19. The apparatus according to claim 17, wherein the criterion specifies that a sum of the actual storage capacities of the memory units in any of the sets does not exceed the target memory size by more than a predefined value.

20. The apparatus according to claim 17, wherein the selection/assembly system is coupled to select a given set by assigning to the given set a given memory unit, which has a largest actual storage capacity among the memory units that have not yet been assigned to any of the sets, and further assigning to the set an additional memory unit, which has a smallest actual storage capacity among the memory units that have not yet been assigned to any of the sets and such that a sum of the actual storage capacities of the memory units in the given set, including the given memory unit and the additional memory unit, meet the predefined criterion.

21. The apparatus according to claim 17, wherein the selection/assembly system comprises:
a selection subsystem, which is coupled to select the sets and to store in at least some of the memory units information indicating an affiliation of the memory units with the sets; and
an assembly subsystem, which is coupled to retrieve the information from the memory units and to assemble the memory devices from the respective sets responsively to the retrieved information.

22. The apparatus according to claim 15, wherein the memory units comprise at least one unit type selected from a group of types consisting of unpackaged memory dies, packaged memory Integrated Circuits (ICs) and magnetic disks.

23. The apparatus according to claim 22, wherein the memory units comprise the unpackaged memory dies, and wherein the multi-unit memory device comprises a Multi-Chip Package (MCP).

24. The apparatus according to claim 15, wherein the definition further specifies a number of the memory units in the multi-unit memory device, wherein the first actual storage capacity is less than the target memory size divided by the specified number of the memory units by no more than 20%, and wherein the second actual storage capacity is greater than the target memory size divided by the specified number of the memory units, such that a sum of the actual storage capacities of the memory units in the at least one of the sets is no less than the target memory size.

25. Apparatus, comprising:
an interface, which is operative to accept a definition of a type of multi-unit memory device that comprises a set of memory units, each having a respective nominal performance level, the definition specifying a target performance level of the multi-unit memory device; and
a selection/assembly system, which is coupled to accept a plurality of the memory units having respective actual performance levels, at least some of which differ from the respective nominal performance levels, and to assemble multi-unit memory devices comprising respective sets of the memory units in accordance with the definition, such that at least one of the sets comprises at least a first memory unit having a first actual performance level that is less than the respective nominal performance level and at least a second memory unit having a second actual performance level that is greater than the nominal performance level, so as to cause the multi-unit memory devices to meet the target performance level.

26. The apparatus according to claim 25, wherein the target performance level, the nominal performance levels and the actual performance levels comprise, respectively, a target power consumption of the multi-unit memory device, nominal power consumptions of the respective memory units and actual power consumptions of the respective memory units.

27. The apparatus according to claim 25, wherein the target performance level, the nominal performance levels and the actual performance levels comprise, respectively, a target programming speed of the multi-unit memory device, nominal programming speeds of the respective memory units and actual programming speeds of the respective memory units.

28. The apparatus according to claim 25, wherein the target performance level, the nominal performance levels and the actual performance levels comprise, respectively, a target reading speed of the multi-unit memory device, nominal reading speeds of the respective memory units and actual reading speeds of the respective memory units.

29. A memory device, which has a target storage capacity and comprises multiple memory units having respective nominal storage capacities and actual storage capacities, wherein one or more of the actual storage capacities are lower than the respective nominal storage capacities and one or more other actual storage capacities are higher than the respective nominal storage capacities, such that a sum of the actual storage capacities of the multiple memory units is no less than the target storage capacity.

30. A memory device, which has a target performance level and comprises multiple memory units having respective nominal performance levels and actual performance levels, wherein one or more of the actual performance levels are lower than the respective nominal performance levels and one or more other actual performance levels are higher than the respective nominal performance levels, such that a composite performance level of the memory device meets the target performance level.

31. A memory device, which comprises a specified number of memory units and has a target memory size, wherein at least one of the memory units has a first actual capacity that is less than the target memory size divided by the specified number of memory units by no more than 20%, and wherein at least one other of the memory units has a second actual capacity that is greater than the target memory size divided by the specified number of units, such that a sum of the actual capacities of the memory units is no less than the target memory size.

* * * * *